United States Patent [19]

Gastiger et al.

[11] Patent Number: 5,527,629
[45] Date of Patent: Jun. 18, 1996

[54] PROCESS OF DEPOSITING A LAYER OF SILICON OXIDE BONDED TO A SUBSTRATE OF POLYMERIC MATERIAL USING HIGH PRESSURE AND ELECTRICAL DISCHARGE

[75] Inventors: Michel-Jacques Gastiger, Orsay; Franciscus Slootman, Le Chesnay; Pascal Bouard, Draveil; Antoine Willemot, Sceaux, all of France

[73] Assignee: L'Air Liquide, Societe Anonyme pour l'Etude et l'Exploitation des Procedes Georges Claude, Paris, France

[21] Appl. No.: 248,560

[22] Filed: May 24, 1994

Related U.S. Application Data

[63] Continuation of Ser. No. 920,371, filed as PCT/FR91/01017, Dec. 17, 1991 publihed as WO92/11312, Jul. 9, 1992, abandoned.

[30] Foreign Application Priority Data

Dec. 17, 1990 [FR] France .................................. 90 15757

[51] Int. Cl.$^6$ ........................................................ B32B 9/00
[52] U.S. Cl. .................... 428/688; 428/702; 427/536; 427/534; 427/488; 427/562; 427/563; 427/583; 427/255.3
[58] Field of Search ..................... 427/536, 591, 427/562, 537, 563, 534, 583, 488, 255.3; 428/209, 688, 689, 701, 702; 264/22, 416

[56] References Cited

U.S. PATENT DOCUMENTS

| 4,563,316 | 1/1986 | Isaka et al. . | |
| 4,927,704 | 5/1990 | Reed et al. . | |
| 5,026,463 | 6/1991 | Dinter | 427/536 |
| 5,107,791 | 4/1992 | Hirokawa | 427/591 |
| 5,185,132 | 2/1993 | Horiike | 422/186.05 |

FOREIGN PATENT DOCUMENTS

| 0311432 | 4/1989 | European Pat. Off. . | |
| 2534262 | 4/1984 | France . | |
| 157472 | 1/1991 | Japan | 427/537 |
| 1135749 | 12/1968 | United Kingdom . | |
| 1188642 | 4/1970 | United Kingdom . | |

OTHER PUBLICATIONS

Wolf, "Silicon Processing for the VLSI Era" vol. 1, Process Technology Aug. 6, 1990.

*Primary Examiner*—Patrick J. Ryan
*Assistant Examiner*—Patrick R. Jewik
*Attorney, Agent, or Firm*—Browdy and Neimark

[57] ABSTRACT

The invention concerns a process for depositing a thin layer of silicon oxide bonded to a substrate of a polymeric material comprising, concomitantly or consecutively (1) subjecting a surface of the substrate to an electrical discharge with dielectric barrier and (2) exposing said surface of the substrate to an atmosphere containing a silane, thus forming a deposit of silicon oxide bonded to said surface of the substrate Application to the production of sheets or films useful for example as food wrapping.

37 Claims, No Drawings

PROCESS OF DEPOSITING A LAYER OF SILICON OXIDE BONDED TO A SUBSTRATE OF POLYMERIC MATERIAL USING HIGH PRESSURE AND ELECTRICAL DISCHARGE

This application is a continuation of application Ser. No. 07/920,371, filed as PCT/FR91/01017, Dec. 17, 1991 published as WO92/11312, Jul. 9, 1992, now abandoned.

The invention concerns a process for depositing a layer of silicon oxide bonded to a substrate of polymeric material.

Synthetic or natural polymeric materials, such as polyolefins, are currently used in various industries. However, their lack of adhesion and wettability and their high permeability to gases restrict their fields of application.

Various treatments have been proposed to overcome these deficiencies of polymeric materials, in particular plastic materials, such as polyolefins. It has thus been proposed to apply to polyolefin films, treatments in liquid phase (sulfochromic), by plasma (corona discharge) or with a flame to improve their property of adhesion and wettability, as well as to provide on such films a deposit of $SiO_2$ by means of gaseous phase under plasma or cathodic pulverization deposits, in order to reduce their permeability to gases.

These proposed treatments are not however fully satisfactory and leave various serious problems to be resolved such as formation of polluting agents, low speed of treatment obtained by techniques in liquid phase, lack of uniformity and selectivity of the treatments with a flame or plasma, or the necessity to work under vacuum to produce a deposit in gaseous phase under plasma or by cathodic pulverization.

There is thus a need for a process for treating substrates of polymeric material which would be non-polluting and which can be carried out at a pressure higher than 10,000 Pa, in line with the plant for the manufacture of the substrate, and which enables to improve the characteristics of adhesion and impermeability to gases of the substrate.

It is an object of the invention to provide a process for depositing a layer of silicon oxide bonded to a substrate of a polymeric material, such as a plastic and more specifically polypropylene, polyethylene or a copolymer thereof.

More particularly, the invention concerns a process for depositing a thin layer of silicon oxide bonded to a substrate of a polymeric material, characterized in that it comprises, concomitantly or consecutively (1) treating a surface of the substrate of polymeric material with an electrical discharge with dielectric barrier at a pressure higher than 10,000 Pa and (2) exposing said substrate surface to an atmosphere containing a silane at a pressure higher than 10,000 Pa, thus resulting in the formation of a deposit of silicon oxide bonded to said substrate surface.

Although the invention is not bound to some kind of theory, a possible explanation for the formation of a deposit of silicon oxide on the substrate having undergone an exposure to an electrical discharge with dielectric barrier is the following: the electrical discharge with dielectric barrier produces a bombardment of electrons, of excited charged species and/or radicals, on the surface of the substrate, which is exposed to the discharge and this bombardment produces sites giving rise to free radicals on the surface of the polymer, which thereafter react with silane with final formation of silicon oxide during exposure to air, oxygen, or possibly another gas including oxygen. Within the scope of the present invention, the term silane means a compound in gaseous form under the conditions of pressure and temperature which are used, and including at least one atom of silicon. A silane according to the invention may therefore consist of a silicon hydride per se, a halogenated silicon hydride, such as $SiCl_4$, $SiH_2Cl_2$, $SiH_3Cl$, $SiHCl_3$, an alkoxysilane such as tetra-ethoxysilane or an organosiloxane.

By "deposit of silicon oxide", is meant a deposit of dioxide of silicon which may also contain a silicon oxide containing sub-stoechiometric amounts of oxygen.

To this day, silicon hydrides, such as $SiH_4$ or $Si_2H_6$ are preferred. $SiH_4$ is more particularly preferred.

The exposure of the substrate which has been treated by electrical discharge with dielectric barrier to an atmosphere containing a silane may be carried out concomitantly with the treatment by electrical discharge with dielectric barrier, by providing an atmosphere containing a silane in the zone where the treatment by electrical discharge with dielectric barrier is carried out while ensuring a contact between the surface of the treated substrate by the electrical discharge with dielectric barrier with an atmosphere containing the silane in a zone next to the zone of treatment by electrical discharge with dielectric barrier.

The treatment by electrical discharge with dielectric barrier consists in producing an electrical discharge between two electrodes, of which one at least is covered with a dielectric material, such as glass, alumina or silica. Such a treatment is conventional and known per se. It may for example consist of a luminescent discharge or "silent glow discharge" or, preferably, a corona discharge.

The treatment by corona discharge is also a conventional treatment which is well known per se, see for example, the article "The flexible adaptation of the effective contact surface" by E. Prinz published in "Plastics Southern Africa", June 1983, pages 50 et seq., and the article "Treatment by corona effect, technical considerations on the equipment", of G. Tuffin published in "Plastiques Modernes et Elastomères" May 1977 pages 54–56, which give indications on the material to be used and the operating conditions. The treatment by electrical discharge with dielectric barrier, in particular by corona discharge, may be carried out in air, nitrogen, oxygen, argon, helium or a mixture thereof when it is not intended to concomitantly carry out an exposure to silane. When it is intended to concomitantly carry out the treatment with silane which leads to a deposit of silicon oxide, the treatment may be carried out by electrical discharge with dielectric barrier in a substantially neutral atmosphere containing silane. In a neutral atmosphere containing silane, the latter may be diluted with an inert gas, such as nitrogen, argon or a mixture thereof, for reasons of safety. It is possible to use, for example, a mixture of nitrogen, argon and silane comprising, preferably 0.01 to 5 volume % of silane. In the case where the exposure to silane is carried out after the treatment by electrical discharge with dielectric barrier, the treated substrate will be contacted with an atmosphere containing the silane where the latter may also be diluted with an inert gas such as argon, the concentration of silane also, preferably, being 0.02 to 5 volume %. The presence of some air in the atmosphere containing silane may be tolerated without disadvantage under certain conditions, for example when the silane concentration is lower than about 2%, whether the exposure to silane is carried out concomitantly or not with the electrical discharge with dielectric barrier.

The electrical discharge with dielectric barrier may be carried out at a pressure between 50,000 and 120,000 Pa, and preferably at atmospheric pressure, the temperature being generally between room temperature and the melting temperature of the treated substrate. When the exposure of the substrate to an atmosphere containing silane is carried out after the electrical discharge with dielectric barrier, the pressure of this atmosphere may also be between 50,000 and 120,000 Pa and preferably may be substantially equal to atmospheric pressure; with respect to its temperature, it may also be between room temperature and the melting temperature of the substrate.

The time of contact of the substrate which has been treated by corona discharge with the atmosphere containing silane is not critical and may for example be chosen as a function of the desired thickness of the deposit of silicon oxide. For example, the time of contact may vary between $10^{-3}$ second to 1 minute or more.

The process according to the invention may be carried out in line with the plant (by extrusion or extrusion-blowing for example) for manufacturing the substrate of polymeric material, or may be carried out on a substrate which has been manufactured and stored before treatment. The substrate may for example be a sheet, a film or a shaped article. The thickness of the substrate is not generally critical and may for example be between 5 μm and 2 cm, and more particularly between 10 and 200 μm.

The process according to the invention is useful for treating substrates of synthetic or natural polymeric material. As an example of natural material, cellulose may be mentioned. In this case, the treated substrate may be paper or cardboard. However, substrates of synthetic polymeric material, in particular of plastic material, are preferred within the scope of the present invention. Among the latters, the more advantageous are made of thermoplastic material, for example polyolefin, such as polyethylene, polypropylene or polystyrene, polyethylene terephtalate, polyamide, vinyl polychloride or polycarbonate. Substrates of polyolefins are more particularly preferred within the scope of the present invention.

An analysis by electronic spectroscopy of the films treated by the process of the invention has shown the presence of a silicon oxide base coating, of small thickness, on the films.

The presence of a modification of the surface of the films treated by the process of the invention has also been demonstrated by the water drop method. This well known method consists in depositing a drop of water (or another liquid) on the surface of the film to be tested, followed by measuring the angle that it forms with the surface. This method has shown that films treated by the present process give rise to a measurement of a smaller angle than that measured on non treated films or those treated only by corona discharge, and therefore have improved properties of wettability.

Preliminary tests concerning the properties of adhesion and permeability to gases have also revealed an improvement of the properties of adhesion and a reduction of the permeability to gases of films according to the invention as compared to non treated reference films.

The non limiting example which follows is given in order to illustrate the invention.

EXAMPLE

A tape of polypropylene 30 mm wide and 1 mm thick was treated by means of a device for treatment by corona discharge by passing the tape continuously, at a speed of 70 cm/minute, between the electrodes of the device between which a maximum voltage of 20 kV under a minimum frequency of 20 kHz could be applied. The electrodes consisted of an upper electrode in the form of a knife (razor blade) and a lower electrode in the shape of a cylinder opposite which the films moved during its passage between the electrodes, the space between the electrodes being about 2 mm. In order to utilize the process according to the invention, two enclosures disposed above the tape as close as possible to the latter were also provided, the first covering the electrode in the shape of a knife and the second being disposed immediately following the first one. The first enclosure could remain filled with air, or be flushed with a flow of nitrogen (in which case the atmosphere inside the first enclosure consisted of nitrogen with a small residue of air) or with a mixture of nitrogen, and $SiH_4$, diluted in argon at 1 volume % of $SiH_4$ (in which case the atmosphere inside the first enclosure consisted of a mixture of nitrogen, argon, $SiH_4$ and residual air containing less than 1 volume % of $SiH_4$) so as to carry out, at will, the treatment by corona discharge in one of these atmospheres, while the second could be filled with air when the atmosphere of the first enclosure consisted of a mixture of nitrogen, argon, $SiH_4$, and residual air, or flushed with a mixture of argon and $SiH_4$ at 1 volume % $SiH_4$ (in which case the atmosphere inside the second enclosure consisted of a mixture of argon, $SiH_4$, and residual air containing less than 1 volume % of $SiH_4$) in the case where the first enclosure was filled with air or nitrogen. The length of the first enclosure was sufficient to cover the electrodes and to provide a distance of about 2 cm between the electrodes and the exit of the tape into the atmosphere. The length of the second enclosure was such that the time of contact of the tape which has been pretreated by corona discharge with the atmosphere of argon, $SiH_4$ and air of the order of 20 seconds.

The following Table summarizes the conditions of the tests and results of tests which have been carried out by the method of the water drop on tapes treated according to the invention as well as on tapes which were not treated or treated by corona discharge only. The effect of a post-washing on various tapes is also indicated.

TABLE

| Sample | Voltage applied kV | 1st enclosure | 2nd enclosure | post washing with water | Angle measured, degrees** |
| --- | --- | --- | --- | --- | --- |
| Not treated (comparative) | — | — | — | No | 87 |
| | | | | Yes | 82 |
| Treated by CD* (comparative) | 12 | air | air | No | 66 |
| | 12 | air | air | Yes | 72 |
| | 12 | $N_2$ | air | No | 63 |
| Treated according | 8 | Nitrogen + argon + $SiH_4$ + residual air | air | No | 82 |

TABLE-continued

| Sample | Voltage applied kV | 1st enclosure | 2nd enclosure | post washing with water | Angle measured, degrees** |
|---|---|---|---|---|---|
| to the invention | 10 | Nitrogen + argon + SiH$_4$ + residual air | air | No | 46 |
| | 12 | Nitrogen + argon + SiH$_4$ + residual air | air | No | 42 |
| | 12 | Nitrogen + argon + SiH$_4$ + residual air | air | Yes | 55 |
| | 13 | Nitrogen + argon + SiH$_4$ + residual air | air | No | 35 |
| | 13 | Nitrogen + argon + SiH$_4$ + residual air | air | Yes | 52 |
| | 12 | air | air + argon + SiH$_4$ | No | 53 |
| | 12 | N$_2$ | air + argon + SiH$_4$ | No | 56 |

*CD = corona discharge
**Angle measured according to the water drop method, more specifically the average of 5 to 10 measuring points.

According to this Table, it may be seen that the best results, with respect to improvement of the wettability, are obtained when the treatment by corona discharge and exposure to silane are carried out concomitantly and that the results are correspondingly improved when the voltage applied to the electrodes is higher. It should be noted, however, that a possible increase of the voltage is limited by the phenomenons of breakdown which may take place.

It may also be observed that the post-washing of the tapes which have been treated by corona discharge only or by the process according to the invention has a tendency to increase the angle formed by the drop of water with the surface of the material tested, while, in the case of a non treated material, this angle is reduced. This difference of behavior is not presently explained. It may also be noted that, as the material treated by corona discharge only has the same behavior as the materials treated according to the invention, the phenomenon of increase of the angle produced by post-washing cannot be explained only by a partial removal of the silicon oxide which has been deposited, but may be due to an effect of aging of the treatment.

The substrates obtained by the process of the invention may find applications in various fields, for example in food wrapping as a replacement for aluminized films or multilayer films, where properties of barrier are required, as substrates that can be metallized, painted, printed or otherwise pre-treated, etc.

It goes without saying that the embodiments described are only examples and that they may be modified, for example by substitution of technical equivalents, without departing from the scope of the invention.

We claim:

1. Process for depositing a thin layer of silicon oxide bonded to a substrate of a polymeric material, characterized in that it comprises the following steps:
   (1) subjecting a surface of the substrate to an electrical discharge with a dielectric barrier at a pressure higher than 10,000 Pa
   (2) exposing said surface of the substrate to an atmosphere containing a silane at pressure higher than 10,000 Pa, and
   (3) exposing said surface of the substrate to an oxygen-containing gas so that there is formed a deposit of silicon oxide bonded to said surface of the substrate;
   wherein steps (1) and (2) are conducted simulatneously or sequentially.

2. Process for depositing a thin layer of silicon oxide bonded to a substrate made from a polymeric material, characterized in that it comprises the following steps: (1) subjecting a surface of the substrate to an electrical discharge with a dielectric barrier at a pressure higher than 10,000 Pa, (2) exposing said surface of the substrate to an atmosphere containing a silane at pressure higher than 10,000 Pa, and (3) exposing said surface of the substrate to an oxygen containing gas so that there is formed a deposit of silicon oxide bonded to said surface of the substrate, wherein steps (1) and (2) are concomitantly carried out.

3. Process according to claim 2, characterized in that the electrical discharge with dielectric barrier is carried out at a pressure between 50,000 and 120,000 Pa.

4. Process according to claim 2, characterized in that said electrical discharge is a corona discharge.

5. Process according to claim 2, characterized in that steps (1) and (2) are carried out by providing an atmosphere containing a silane while the treatment by electrical discharge with a dielectric barrier is carried out.

6. Process according to claim 2, characterized in that the oxygen containing gas is air.

7. Process according to claim 2, characterized in that the atmosphere containing a silane comprises 0.01 to 5 volume % of said silane.

8. Process according to claim 2, characterized in that the silane is a silicon hydride, a halogenated silane, an alkoxysilane or an organosiloxane.

9. Process according to claim 8, characterized in that the silane is SiH$_4$.

10. Process according to claim 2, characterized in that the atmosphere comprising silane additionally includes an inert gas selected from nitrogen, argon, helium or a mixture thereof.

11. Process according to claim 2, characterized in that said polymeric material is natural or synthetic.

12. Process according to claim 11, characterized in that the said polymeric material is a polyolefin, a polyethylene, a terephtalate, a polyamide, a vinyl polychloride or a polycarbonate.

13. Process according to claim 2, characterized in that the polymeric material is a polyolefin.

14. Process according to claim 2, characterized in that the substrate is a sheet or a film.

15. Process according to claim 2, characterized in that said pressure is at about atmospheric pressure.

16. Process according to claim 2, characterized in that steps (1) and (2) are carried out at a temperature comprised between room temperature and the melting temperature of the substrate.

17. Process according to claim 11, characterized in that the natural polymeric material is cellulose.

18. Process according to claim 11, characterized in that the synthetic polymeric material is a plastic.

19. A product produced by the process of claim 2.

20. Process for depositing a thin layer of silicon oxide bonded to a substrate made from a polymeric material, characterized in that it comprises the following steps: (1) subjecting a surface of the substrate to an electrical discharge with dielectric barrier at a pressure higher than 10,000 Pa so as to produce free radicals on the surface, (2) exposing said surface of the substrate to an atmosphere containing a silane at pressure higher than 10,000 Pa so that the silane react with said free radicals, and (3) exposing said surface of the substrate to an oxygen containing gas, so that there is formed a deposit of silicon oxide bonded to said surface of the substrate, wherein steps (1) and (2) are consecutively carried out.

21. Process according to claim 20 characterized in that the electrical discharge with dielectric barrier is carried out at a pressure between 50,000 and 120,000 Pa.

22. Process according to claim 20, characterized in that said electrical discharge is a corona discharge.

23. Process according to claim 20, characterized in that step (1) is carried out in air or an inert gas, and in that operation (2) is carried out by exposing the substrate having undergone operation (1) to an atmosphere containing a silane and which is present following the treatment by electrical discharge with dielectric discharge.

24. Process according to claim 20, characterized in that the said oxygen containing gas is air or oxygen.

25. Process according to claim 20, characterized in that the atmosphere containing a silane comprises 0.01 to 5 volume % of said silane.

26. Process according to claim 20, characterized in that the silane is a silicon hydride, a halogenated silane, an alkoxysilane or an organosiloxane.

27. Process according to claim 26, characterized in that the silane is $SiH_4$.

28. Process according to claim 20, characterized in that the atmosphere comprising silane additionally includes an inert gas selected from nitrogen, argon, helium or a mixture thereof.

29. Process according to claim 20, characterized in that said polymeric material is natural or synthetic.

30. Process according to claim 20, characterized in that the said polymeric material is a polyolefin, a polyethylene, a terephtalate, a polyamide, a vinyl polychloride or a polycarbonate.

31. Process according to claim 30, characterized in that the polymeric material is a polyolefin.

32. Process according to claim 20, characterized in that the substrate is a sheet or a film.

33. Process according to claim 20, characterized in that said pressure is at about atmospheric pressure.

34. Process according to claim 20, characterized in that steps (1) and (2) are carried out at temperature comprised between room temperature and the melting temperature of the substrate.

35. Process according to claim 29, characterized in that the natural polymeric material is cellulose.

36. Process according to claim 29, characterized in that the synthetic polymeric material is a plastic.

37. A product produced by the process of claim 20.

* * * * *